US009593876B2

(12) United States Patent
Smith

(10) Patent No.: US 9,593,876 B2
(45) Date of Patent: Mar. 14, 2017

(54) COOLING ELECTRONIC DEVICES INSTALLED IN A SUBSURFACE ENVIRONMENT

(71) Applicant: David Smith, Austin, TX (US)

(72) Inventor: David Smith, Austin, TX (US)

(*) Notice: Subject to any disclaimer, the term of this patent is extended or adjusted under 35 U.S.C. 154(b) by 21 days.

(21) Appl. No.: 14/378,261

(22) PCT Filed: Aug. 9, 2013

(86) PCT No.: PCT/US2013/054414
§ 371 (c)(1),
(2) Date: Aug. 12, 2014

(87) PCT Pub. No.: WO2014/039212
PCT Pub. Date: Mar. 13, 2014

(65) Prior Publication Data
US 2015/0000319 A1    Jan. 1, 2015

Related U.S. Application Data

(60) Provisional application No. 61/698,365, filed on Sep. 7, 2012.

(51) Int. Cl.
F25D 23/12 (2006.01)
F25D 3/00 (2006.01)
(Continued)

(52) U.S. Cl.
CPC .............. *F25D 3/00* (2013.01); *F25B 30/06* (2013.01); *F25D 1/00* (2013.01); *F28D 20/0052* (2013.01);
(Continued)

(58) Field of Classification Search
CPC ........ F25D 3/00; F25D 2331/00; F25B 30/06; F28D 20/0052; H05K 7/2079; Y02E 70/30
See application file for complete search history.

(56) References Cited

U.S. PATENT DOCUMENTS 3,566,958 A    3/1971 Zelina
3,648,113 A    3/1972 Rathjen et al.
(Continued)

FOREIGN PATENT DOCUMENTS

JP    H0945551 A  *  2/1997
JP    4903295 A       3/2012
KR    WO2010021480 A2 *  2/2010

OTHER PUBLICATIONS

Takashi et al., Gas Insulated Stationary Induction Apparatus, Feb. 14, 1997, JPH0945551A, Whole Document.*
(Continued)

*Primary Examiner* — Larry Furdge
(74) *Attorney, Agent, or Firm* — Hulsey, P.C.

(57) ABSTRACT

An apparatus and method for cooling of electronic equipment, for example a computer system, in a subsurface environment including a containment vessel in at least partial contact with subsurface liquid or solid material. The containment vessel may be disposed in a variety of subsurface environments, including boreholes, man-made excavations, subterranean caves, as well as ponds, lakes, reservoirs, oceans, or other bodies of water. The containment vessel may be installed with a subsurface configuration allowing for human access for maintenance and modification. Geothermal cooling is achieved by one or more fluids circulating inside and/or outside the containment vessel, with a variety of configurations of electronic devices disposed within the containment vessel. The circulating fluid(s) may be cooled in place by thermal conduction or by active transfer of the fluid(s) out of the containment vessel to an external, possibly geothermal, heat exchange mechanism, then back into the containment vessel.

24 Claims, 7 Drawing Sheets

(51) Int. Cl.
*H05K 7/20* (2006.01)
*F28D 20/00* (2006.01)
*F25B 30/06* (2006.01)
*F25D 1/00* (2006.01)

(52) U.S. Cl.
CPC ....... *H05K 7/2079* (2013.01); *H05K 7/20218* (2013.01); *F25D 2331/00* (2013.01); *Y02E 60/142* (2013.01); *Y02E 70/30* (2013.01)

(56) References Cited

U.S. PATENT DOCUMENTS

| | | | |
|---|---|---|---|
| 3,737,728 A | | 6/1973 | Austin |
| 3,865,183 A | | 2/1975 | Roush |
| 3,965,694 A | | 6/1976 | Vignal et al. |
| 4,203,129 A | | 5/1980 | Oktay et al. |
| 4,240,268 A | * | 12/1980 | Yuan .................. F24F 5/0046 126/400 |
| 4,993,483 A | | 2/1991 | Harris et al. |
| 6,397,933 B1 | | 6/2002 | Enlund |
| 6,450,247 B1 | | 9/2002 | Raff |
| 7,363,769 B2 | | 4/2008 | Kidwell et al. |
| 7,724,517 B2 | | 5/2010 | Attlesey et al. |
| 7,905,106 B2 | | 3/2011 | Attlesey |
| 7,911,782 B2 | | 3/2011 | Attlesey et al. |
| 7,911,793 B2 | | 3/2011 | Attlesey et al. |
| 7,961,475 B2 | | 6/2011 | Campbell et al. |
| 8,009,419 B2 | | 8/2011 | Attlesey et al. |
| 8,089,764 B2 | | 1/2012 | Attlesey et al. |
| 8,089,766 B2 | | 1/2012 | Attlesey et al. |
| 8,467,189 B2 | | 6/2013 | Attlesey et al. |
| 2009/0283386 A1 | | 11/2009 | Diluoffo et al. |
| 2009/0287881 A1 | | 11/2009 | Kruus et al. |
| 2010/0254087 A1 | | 10/2010 | Godfroy et al. |
| 2012/0103566 A1 | | 5/2012 | Iyengar et al. |
| 2013/0081781 A1 | | 4/2013 | Chainer et al. |
| 2013/0081790 A1 | | 4/2013 | Tufty et al. |

OTHER PUBLICATIONS

Kang, Underground Container System for Electric Utility, Feb. 25, 2010, WO2010021480A2, Whole Document.*
"New 'Green' Data Center to Utilize Geothermal Cooling Design", http://www.bizjournals.com/ seattle/blog/techflash/2010/08/new_green_data_center_to_utilize_geothermal_cooling.html, Aug. 25, 2010.
"Does Geothermal Cooling Make Sense for your Data Center?", http://www.zdnet.com/ blog/datacenter/does-geothermal-cooling-make-sense-for-your-datacenter/416, Aug. 26, 2010.
"Geothermal Cooling Systems: Planning and Foresight Key to Their Success in Data Centers", http://www.processor.com/articles//P3307/26p07/26p07.pdf?guid=, Apr. 8, 2011.
"The World's First Zero-Emissions 'Natural Cooling' Data Center", http://www.abb.us/ cawp/seitp202/019226fce7826568c125791800269733.aspx, Oct. 4, 2011.
"Aussie Supercomputer Center to Use Geothermal Cooling", http://www.earthtechling.com/ 2013/03/aussie-supercomputer-center-to-use-geothermal-cooling/, Mar. 2013.
"Geothermal Cooling and Other Oddities", http://www.transformeddc.com/ author.asp?section_id=2800&doc_id=260169, Mar. 7, 2013.

* cited by examiner

COOLING ELECTRONIC DEVICES INSTALLED IN A SUBSURFACE ENVIRONMENT

RELATED APPLICATION

This application claims the priority of U.S. Provisional 61/698,365, filed on Sep. 7, 2012 and entitled "GEOTHERMALLY COOLED COMPUTER HARDWARE SYSTEM DESIGNED FOR SUBSURFACE INSTALLATION".

TECHNICAL FIELD

This disclosure relates to a system and method for geothermally cooling electronic devices, including but not limited to computer systems, by installing the electronic devices in subsurface environments such as boreholes, excavations, or bodies of water.

BACKGROUND

Large-scale data centers typically house hundreds or thousands of computer systems in high-density configurations (side-by-side racks, with multiple computing nodes per rack) in an above-ground building. Some sources estimate that up to 50% of the electrical power consumption for data centers is dedicated to cooling the environment in which the computer systems operate.

The heat generated by the internal electronic components of computing devices has long been a significant factor determining the overall system design of computer systems. The most common forms of heat dissipation in early personal computer designs were direct physical contact between the heat-generating integrated circuit chip and a heat-conducting mass such as aluminum, and non-turbulent airflow, typically generated by electrical fans, to circulate cool air through a space interior to the computer system housing. In the early large-scale computing systems of the 1940s and 1950s, heat dissipation consisted primarily of ventilation apertures in housings, followed by ambient-air fans and blowers which cooled by forced air convection.

Zelina, in U.S. Pat. No. 3,566,958 (1971), describes a means of thermally coupling heat conductors to integrated circuit chips, though without addressing how to transport the heat contained in the heat-conducting material away from the space surrounding the electrical device. In U.S. Pat. No. 3,648,113 (1972) Rathjen describes a means of stacking planar electronic devices, with spacing between the flat planes, and cooling the entire assembly using fluid flow across the flat surfaces; the cooling fluid exits the entire assembly, thereby transporting heat away from the heat-generating electronics. Austin, in U.S. Pat. No. 3,737,728 (1973) discloses a mounting structure for fragile heat-generating devices (e.g. devices used in computer apparatuses), as well as uniformity of heat conduction and good heat dissipation away from the core assembly area. These ideas are combined in U.S. Pat. No. 3,865,183 (1975), in which Roush describes a more comprehensive means of constructing a full computer assembly with good heat dissipation characteristics of the individual circuit boards in the module, with fluid flow for removal of heat energy from the assembly.

As semiconductor densities in computing devices continued to increase, progressively more heat was generated by the devices. Beginning in the 1980s a series of advancements was made in the heat removal capabilities of computer systems, primarily through the use of liquids. Oktay, in 1980 (U.S. Pat. No. 4,203,129) described the bonding of a heat sink to the surface of a heat-generating electronic device, and immersing the other surfaces of the heat sink in a liquid, which circulates through tunnels in the heat sink material. This innovation was followed by others too numerous to mention by inventor and patent number, including: jacketing the CPU of a computer and placing liquid coolant directly in contact with the CPU jacket, with or without pumps for circulation of the liquid; increasingly complex valves and other electronically controlled redundant cooling components for one or more CPUs or other heat generating electronic components; various designs for the channels and pipes carrying the liquid coolant; closed loop and open loop systems with physical contact between loop housings and varying degrees of fluid exchange between them.

The cooling capacity of the earth's subsurface has long been recognized as a potential energy-saving feature of systems that cool inhabited environments. Because the subsurface maintains essentially a constant temperature at a given depth and the rock and/or artesian mass and volume of the subsurface are vast, heat can be exchanged with either warmer surface fluid, thereby providing cooling, or cooler surface fluid, thereby providing warming. Vignal and Chapuis, in U.S. Pat. No. 3,965,694 (1976) describe a means of exchanging heat with the earth's subsurface via a U-shaped line or pipe buried in a deep hole bored in the earth; their design is directed at systems for warming or cooling above-ground air. Many devices since then have been disclosed that improve on various aspects of air-conditioning designs and provide for more efficient heat transfer between above-ground fluids and subsurface rock or liquid.

The use of subsurface thermal capacity to control the operating temperature of electronic equipment was disclosed by Enlund in U.S. Pat. No. 6,397,933 (2002) for equipment installed in a station and by Kidwell and Fraim in U.S. Pat. No. 7,363,769 (2008) for the cooling of electronic equipment at the base of an electromagnetic signal transmission/reception tower. The subject matter disclosed by Kidwell and Fraim describes a method and apparatus for using coaxial flow heat exchanging structures for regulating the temperature of heat-generating electronics installed in the base housing of an electromagnetic signal transmission/reception tower. The heat transfer is effected using a fluid flow loop from the surface to the underground environment and back to the surface. Chainer, in U.S. Pat. Application No. 2013/0081781 describes a system for data center cooling wherein heat transfer fluid is removed from the indoor volume of the data center and cooled via ambient air and geothermal heat exchange processes.

Attlesey, et al. in U.S. Pat. No. 7,724,517 (2010) disclose a design of a case for a liquid submersion cooled electronic device; the embodiments described therein include a liquid-tight case for enclosing electronic equipment, with at least a portion of one of the walls composed of translucent or transparent material for visibility into the interior of the case. In several subsequent patents, Attlesey describes cooling of electronic equipment by means of a dielectric liquid circulating in and through a fluid-tight container. Tufty et al. disclose a similar approach in U.S. Pat. Application No. 2013/0081790 (April 2013). Campbell, et al. in U.S. Pat. No. 7,961,475 (June 2011) describe an apparatus and method for immersion cooling of one or more electronic subsystems in which cooling fluid passes in and out of one or more containers docked within an electronics rack.

In conclusion, the heat generated by computer and other electronic hardware results in significant cooling costs in environments, such as data centers, where systems are deployed in high density configurations.

Unless specifically stated as such, the preceding is not admitted to be prior art and no statement appearing in this section should be interpreted as a disclaimer of any features or improvements listed.

BRIEF DESCRIPTION OF THE INVENTION

At least one embodiment described herein provides a geothermal cooling mechanism for electronic devices and systems of devices, including but not limited to computer hardware systems, installed in a subsurface environment. The design provides a significant improvement in long-term electronic equipment operating costs by eliminating the need to remove heat from the human-inhabited environment of the facility in which the hardware is installed. The increased cooling capability of the subsurface environment is likely to lead to a lower average operating temperature of the hardware, which will translate into a longer average operational lifetime of the hardware. The design also results in a very high security physical installation for electronic equipment systems.

The computer hardware or other electronic equipment can be installed as individual units or in a high-density configuration. Designs are optimized for effective and efficient direct transfer of thermal energy away from heat-generating electronics into the surrounding environment. The computer systems dissipates internally generated heat from the surface of an enclosure to the near-infinite cooling mass of the earth's underground or a large body of water, either through direct contact, or using a heat-transporting fluid in contact with at least some portion of the outer surfaces of the individual components or subsystems within the installation. Throughout this disclosure and the accompanying claims, fluid is intended to include gases (e.g. atmospheric air, helium, nitrogen, etc), liquids (e.g. mineral oil, silicone oil, water), etc. or a combination of gases and liquids. The exterior surface of the enclosure is preferably composed of materials conducive to heat transfer. The enclosure has entrances, optionally liquid-tight, for power, networking, and other control and monitoring signals and functions. Heat may be transferred from the fluid directly into the subsurface environment via passive or forced circulation, or the fluid may be circulated away from the computer hardware enclosure or containment vessel, cooled in a remote location, then re-circulated back to the computer hardware enclosure or containment vessel at a lower temperature.

Multiple configuration options are described optimized for installation into a variety of subsurface environments, such as, but not limited to, a naturally occurring or man-made borehole, excavation, structure, well hole, or body of water (e.g. stock tank, reservoir, lake, pool, river, ocean, sea, stream, wetland, etc.). The installation can be in any orientation and can be positioned at the surface or any distance below the surface, with or without direct contact to the above-surface environment. The computer system casing may be of solid construction, or it may be of a hollow construction that provides an increased surface area and a channel through which may flow fluid for heat transfer. Computer system casing units may be stacked or grouped together to form a single structural unit, or they may be in close proximity as single units not in direct contact with other units.

These and other aspects of the disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following FIGUREs and detailed description. It is intended that all such additional systems, methods, features and advantages that are included within this description, be within the scope of the appended claims and any claims filed later.

BRIEF DESCRIPTION OF FIGURES

The novel features believed characteristic of the disclosed subject matter will be set forth in the appended claims and any claims filed later. The disclosed subject matter itself, however, as well as a preferred mode of use, further objectives, and advantages thereof, will best be understood by reference to the following detailed description of illustrative embodiments when read in conjunction with the accompanying drawings, wherein:

DETAILED DESCRIPTION

Although described with reference to certain embodiments, those with skill in the art will recognize that the disclosed embodiments have relevance to a wide variety of areas in addition to the specific examples described below. Further, elements from one or more embodiments may be used in other embodiments and elements may be removed from an embodiment and remain within the scope of this disclosure.

All references, including publications, patent applications, and patents, cited herein are hereby incorporated by reference to the same extent as if each reference were individually and specifically indicated to be incorporated by reference and were set forth in its entirety herein; provided, however, to the extent there exists a conflict between this disclosure and a document incorporated by reference, this disclosure shall control.

In its most basic embodiment, the design consists of a computer hardware system, either as an individual unit or as a cluster of units, installed in a case designed to conduct heat from the computer hardware system to a fluid within a containment vessel in a subsurface environment; cooling of the computer hardware system is accomplished by geothermal heat transfer from the containment vessel fluid to the external subsurface environment. The containment vessel exists primarily or entirely below ground level, and can have any size, shape, or orientation as dictated by the constraints of the particular installation requirements.

Figure 1:
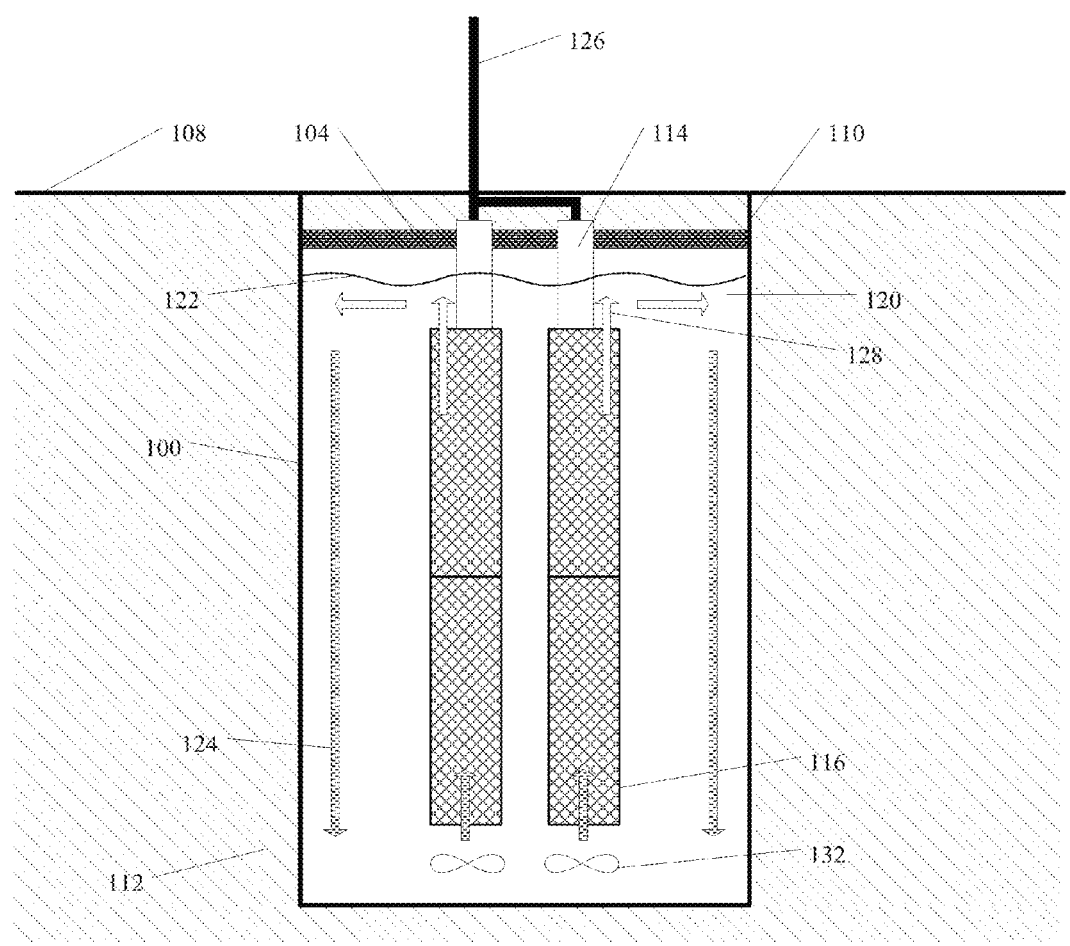
FIG. 1 shows a conceptual cross-section of a convection type geothermal cooled computer hardware system designed for subsurface installation according to an embodiment of the disclosed subject matter.

FIG. 1 depicts a basic embodiment of the design. The containment vessel 100 is a sealed or unsealed structure which is near or any distance below surface level 108. The containment vessel 100 is installed in either a removable or non-removable fashion in surrounding physical materials 112 such as earth, water, or concrete. The sealed embodiment will have a sealing cap 104 which may be covered by surrounding physical materials 112. The unsealed embodiment will have containment vessel walls 110 that extend to the surface of the surrounding physical materials 112. A liquid-tight connector assembly 114 extends through any sealing cap 104 to provide an entry port for power, control and electrical signal cabling 126 to and from one or more computer hardware systems 116, each of which consists of one or more individual electronic device subsystems. The cooling fluid 120 with surface level 122 fills some or all of the containment vessel 100 volume and surrounds the computer hardware systems 116. The cooling fluid 120 is cooled by geothermal heat conduction into the surrounding subsurface mass; the cooled fluid moves downward convectively 124 near the containment vessel 100 wall, and the warmer fluid moves convectively upward 128 as it gains heat from the computer hardware systems 116. Fluid flow may be augmented by an optional fluid circulator 132 which forces fluid upward from the lower region of the containment vessel 100. Fluid flow in and around the computer hardware system 116 may be accomplished by embodiments such as those described in FIGS. 4, 5, 6, and/or 7.

Figure 2:
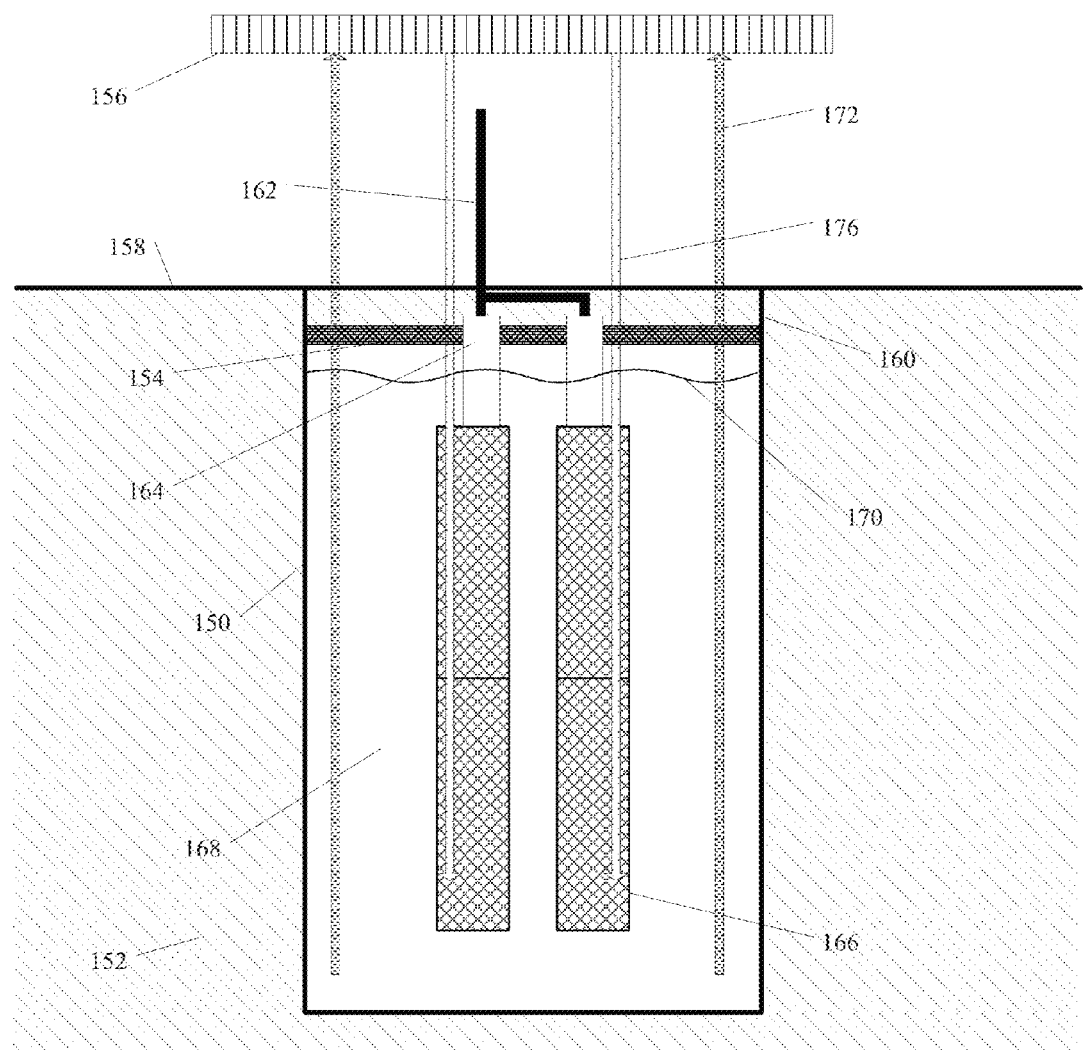
FIG. 2 shows a conceptual cross-section of a heat exchanger type geothermal cooled computer hardware system designed for subsurface installation according to an embodiment of the disclosed subject matter.

FIG. 2 shows a configuration similar to that of FIG. 1, the primary difference being that warmer fluid 172 is removed from the containment vessel 150 at higher temperature and transferred to a remote location for geothermal heat exchange 156 or other method of heat exchange; after the fluid is cooled remotely by geothermal heat exchange 156 or other method, it is transferred 176 back into the containment vessel 150. The containment vessel 150 is a sealed or unsealed structure which is near or any distance below surface level 158. The containment vessel 150 is installed in either a removable or non-removable fashion in surrounding physical materials 152 such as earth, water, or concrete. The sealed embodiment will have a sealing cap 154 which may be covered by surrounding physical materials 152. The unsealed embodiment will have containment vessel walls 160 that extend to the surface of the surrounding physical materials 152. A liquid-tight connector assembly 164 extends through any sealing cap 154 to provide an entry port for cooling fluid, power, control and electrical signal cabling 162 to and from one or more computer hardware systems 166, each of which consists of one or more individual electronic device subsystems. The cooling fluid 168 with surface level 170, which fills some or all of the containment vessel 150 volume, surrounds the electronic devices or systems 166, each of which consists of one or more electronic devices. In this embodiment the cooling fluid 168 is pumped to a geothermal heat exchange system 156 or other heat exchanger installed external to, and either adjacent to or remote from, the containment vessel 150. The geothermal heat exchange unit 156 uses primary or secondary geothermal heat exchange such as open or closed loop earth or water geothermal heat sinks, and cools the fluid for reinsertion 176 into the interior of the containment vessel 150. Fluid flow in and around the computer hardware systems 166 may be accomplished by embodiments such as those described in FIGS. 4, 5, 6, and/or 7.

Figure 3:
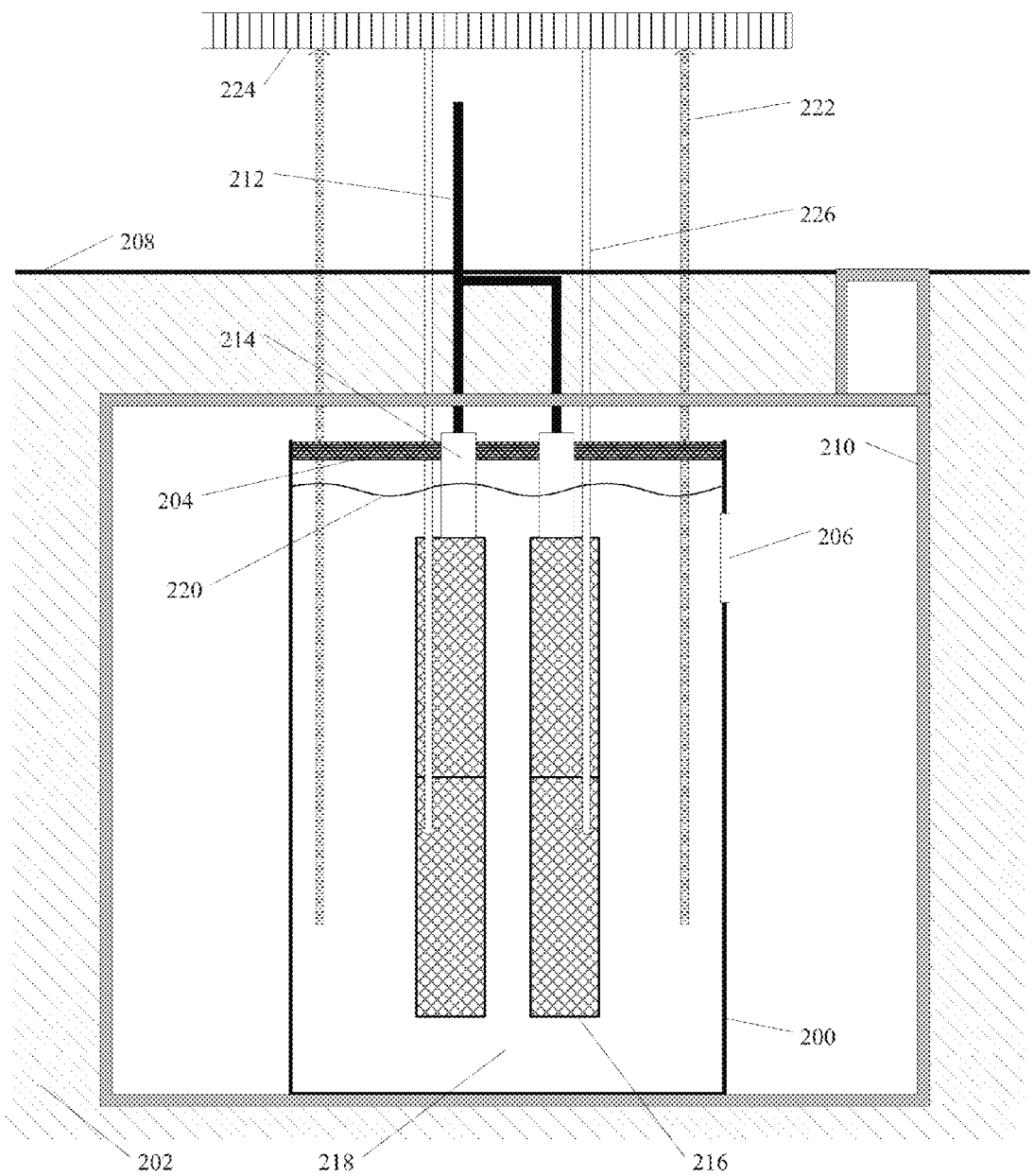
FIG. 3 shows a conceptual cross-section of a heat exchanger type geothermal cooled computer hardware system designed for a human-accessible subsurface installation according to an embodiment of the disclosed subject matter.

FIG. 3 shows a configuration similar to that of FIG. 2, the primary difference being the presence of a secondary containment vessel 210 that is sufficiently large and of the correct environment and structure to facilitate human access, inspection, and maintenance of at least a portion of the entire assembly. The containment vessel 200 is installed in either a removable or non-removable fashion inside the secondary containment vessel 210. The secondary containment vessel 210 is installed in surrounding physical materials 202 such as earth, water, or concrete and contains a human accessible extension to the surface. The containment vessel 200 is a sealed or unsealed structure which is near or any distance below surface level 208. The sealed embodiment will have a sealing cap 204; the sealed and unsealed embodiments will allow human access inside the containment vessel 200, optionally through an access panel or port 206. A liquid-tight connector assembly 214 extends through any sealing cap 204 to provide an entry port for cooling fluid, power, control and electrical signal cabling 212 to and from one or more computer hardware system 216, each of which consists of one or more individual electronic devices. The cooling fluid 218 with surface level 220, which fills some or all of the containment vessel 200 volume, surrounds the computer hardware systems 216, each of which consists of one or more individual electronic device subsystems. The warmer fluid 222 is removed from the containment vessel 200 at higher temperature and transferred to a remote location for geothermal heat exchange 224; after the fluid is cooled remotely by a geothermal heat exchange system 224 or other heat exchanger, it is transferred 226 back into the containment vessel 200. The cooling fluid 222 is pumped to a geothermal heat exchange 224 installed external to, and either adjacent to or remote from, the containment vessel 200. The geothermal heat exchange unit 224 uses primary or secondary geothermal heat exchange such as open or closed loop earth or water geothermal heat sinks, or other heat exchange system, and cools the fluid 226 for reinsertion into the interior of the containment vessel 200. Fluid flow in and around the computer hardware systems 216 may be accomplished by embodiments such as those described in FIGS. 4, 5, 6, and/or 7.

Figure 4:
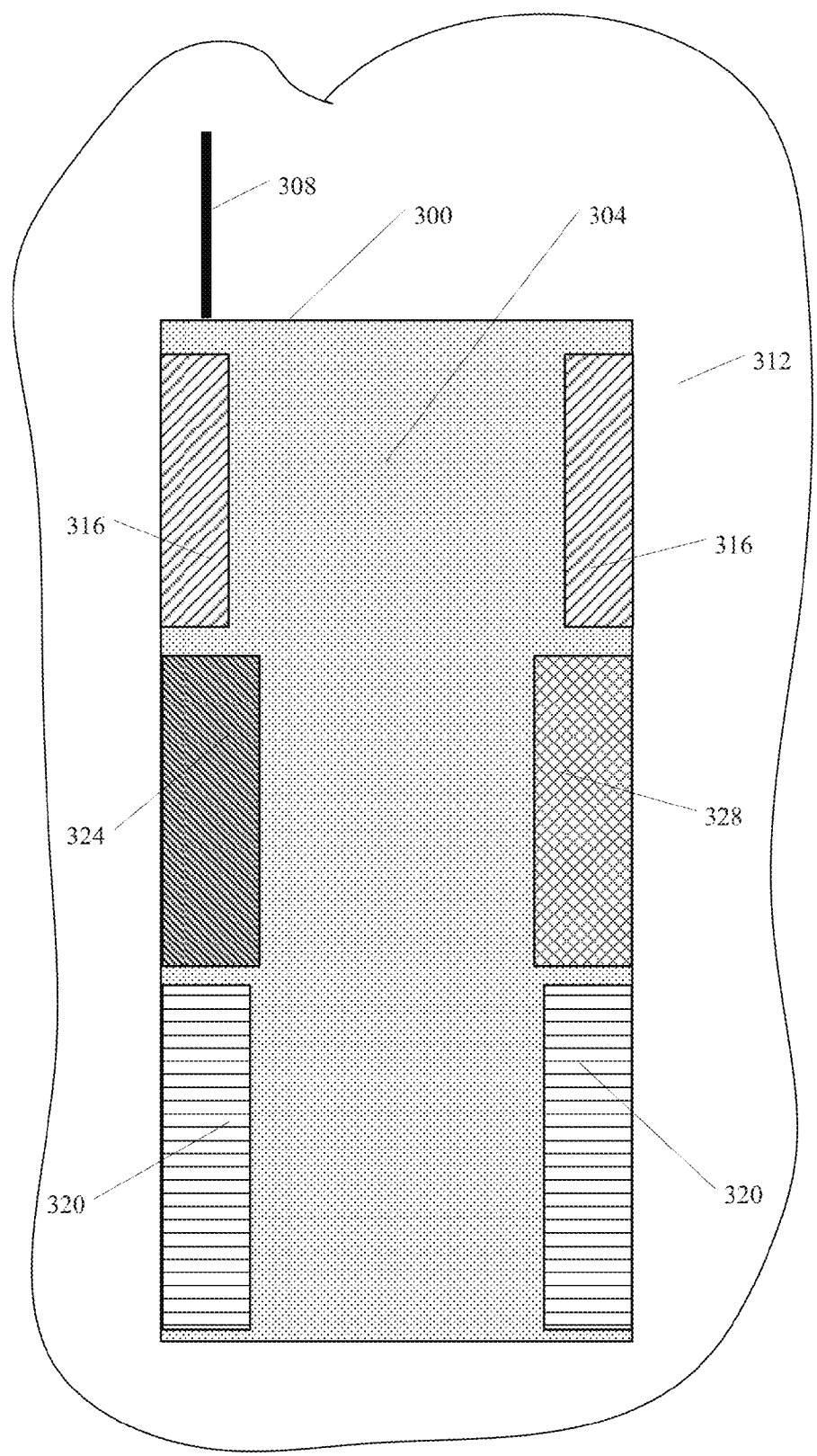
FIG. 4 shows a conceptual cross-section of a computer cluster designed for subsurface installation that contains computer component assemblies that are cooled by external cooling fluid circulation according to an embodiment of the disclosed subject matter.
Figure 5:
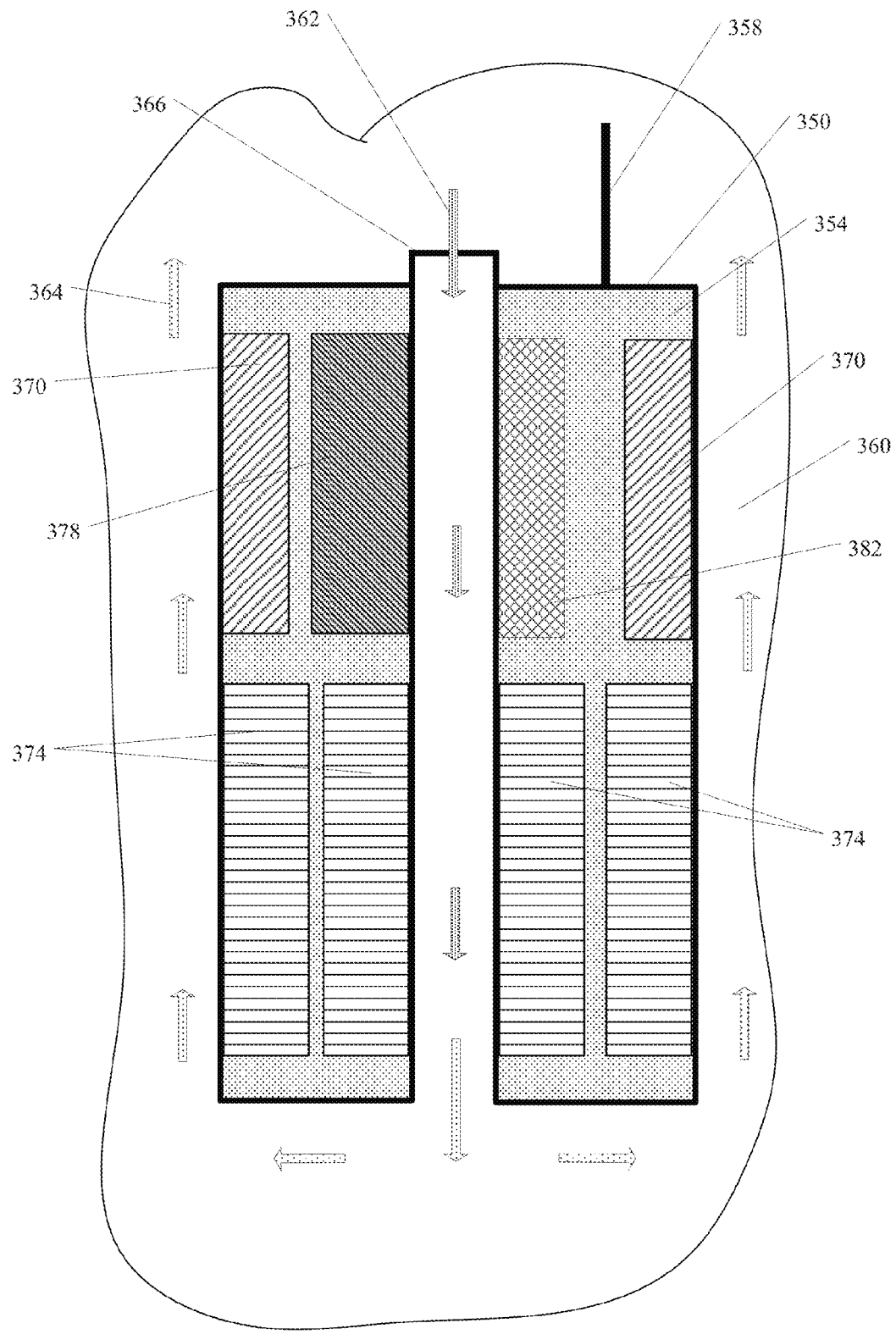
FIG. 5 shows a conceptual cross-section of a computer cluster designed for subsurface installation that contains computer component assemblies that are cooled by interior channel and external cooling fluid circulation according to an embodiment of the disclosed subject matter.
Figure 6:
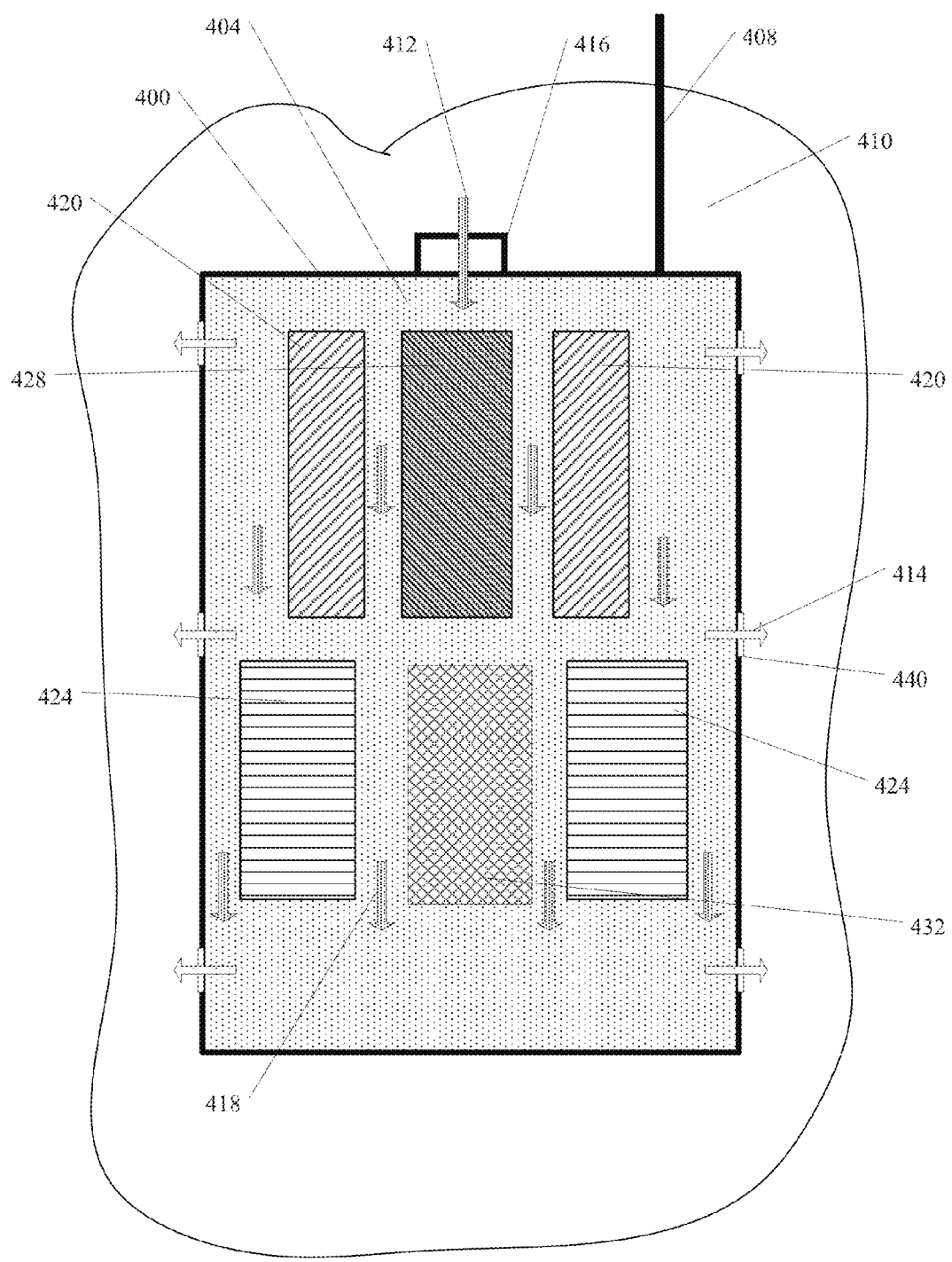
FIG. 6 shows a conceptual cross-section of a computer cluster designed for subsurface installation that contains computer component assemblies that are cooled by internal cooling fluid circulation according to an embodiment of the disclosed subject matter.

FIG. 4 shows a conceptual cross-section of an embodiment of a grouping of electronic devices or systems; for the purpose of the embodiments depicted in FIGS. 4, 5, 6 and/or 7 such grouping will be called a computer cluster. This embodiment provides an enclosure 300 for the computer cluster, with a fluid filled interior space 304, and an entry port for power, control and electrical signal cabling 308. The exterior surface of the enclosure 300 is in contact with a surrounding cooling fluid 312 which circulates and is cooled in any of the manners described for FIGS. 1, 2, and/or 3 above. The components which are interior to the enclosure 300 include one or more power supplies 316, one or more data storage assemblies 320 consisting of disk drives or other type of storage units, one or more motherboard assemblies 324, and other computer hardware 328 that may be required by a particular application. The motherboard assembly 324, power supply assembly 316, data storage assembly 320, and customized computer assembly 328 are assemblies that contain standard computer components that have been arranged in a manner to facilitate proper computer operation and optimal heat transfer; they may be bracket mounted and open to the interior of the computer cluster enclosure 300 or each assembly may be fully enclosed as a unit in order to either contain a secondary cooling fluid such as a dielectric or to isolate the assembly from direct contract with either the primary or another secondary cooling liquid. Each assembly 324, 316, 320, 328 will have cable entrances for power and electrical signaling that serve to interconnect the assemblies as required for computer operation. Each assembly 324, 316, 320, 328 may be mounted in such a fashion as to transfer heat directly from the assembly to the wall of the computer cluster enclosure. The interior of the computer cluster enclosure 304 may contain fluids separated by interior partitions and control structures that serve to transfer heat from the inward facing surfaces of assemblies 324, 316, 320, 328 to the outer wall of the computer cluster enclosure 300. The electronic devices or systems interior to the enclosure 300 do not need to be arranged exactly as shown and may have various arrangements to facilitate heat transfer and operation. Multiple computer cluster enclosures 300 may be connected in a single logical and/or physical structure as to form a single operating and/or installed unit.

FIG. 5 shows a conceptual cross-section of an embodiment of a computer cluster. This embodiment has a pipe-like cylindrical or tubular enclosure of various cross-sectional geometries and lengths that allow the flow of cooling fluid 360 through one or more channels in its central space. The computer cluster has a computer cluster enclosure 350 with a gas or liquid filled interior space 354, and an entry port for power, control and electrical signal cabling 358. The exterior surface of the computer cluster enclosure 350 is in contact with a surrounding cooling fluid 360. The interior space of the computer cluster enclosure 350 has a sealing cap 366 with an entry port through which the cooling fluid is forced 362. The cooling fluid 360 is warmed by contact with the surfaces of the computer cluster enclosure 350 as it flows downward 362; the cooling fluid 360 exits at the bottom of the computer cluster enclosure, then flows across the computer cluster enclosure 350 surfaces as it rises 364; the cooling fluid 360 is circulated and cooled in any of the manners described for FIGS. 1, 2, and/or 3 above. The computer components interior to the computer cluster enclosure 350 include one or more power supplies 370, one or more data storage assemblies 374 consisting of disk drives or other type of storage units, one or more motherboard assemblies 378, and other computer hardware 382 that may be required by a particular application. The motherboard assembly 378, power supply assembly 370, data storage assembly 374, and customized computer assembly 382 are assemblies that contain standard computer components that have been arranged in a manner to facilitate proper computer operation and optimal heat transfer; they may be bracket mounted and open to the interior of the computer cluster enclosure 350 or each assembly may be fully enclosed as a unit in order to either contain a secondary cooling fluid such as a dielectric or to isolate the assembly from direct contract with either the primary or another secondary cooling fluid. Each assembly 378, 370, 374, 382 will have cable entrances for power and electrical signaling that serve to interconnect the assemblies as required for computer operation. Each assembly 378, 370, 374, 382 may be mounted in such a fashion as to transfer heat directly from the assembly to the wall of the computer cluster enclosure. The interior of the computer cluster enclosure 354 may contain gases and/or liquids separated by interior partitions and control structures that serve to transfer heat from the inward facing surfaces of assemblies 378, 370, 374, 382 to the outer wall of the computer cluster enclosure 350. The computer components interior to the enclosure 350 do not need to be arranged exactly as shown and may have various arrangements to facilitate heat transfer and operation. The circulation of the cooling fluid 360 may be reversed by moving the sealing cap 366, through which the cooling fluid is forced 362, to the bottom of the computer cluster enclosure 350. Multiple computer cluster enclosures 350 may be connected in a single logical and/or physical structure as to form a single operating and/or installed unit.

FIG. 6 shows a conceptual cross-section of an embodiment of a computer cluster. This embodiment has a pipe-like cylindrical or tubular enclosure of various cross-sectional geometries and lengths that allow the flow of cooling fluid 410 through the interior of the computer cluster enclosure 400 and around the interior assemblies 418. The computer cluster enclosure 400 has a fluid filled interior space 404 and an entry port for power, control, and electrical signal cabling 408. The exterior surface of the computer cluster enclosure 400 is in contact with a surrounding cooling fluid 410. The computer cluster enclosure 400 has a sealing cap 416 with an entry port through which the cooling fluid is forced 412. The cooling fluid 410 is warmed by contact with the interior assemblies 418 and exits the enclosure 414 through the exit ports 440 into the containment vessel. The cooling fluid 410 is circulated and cooled in any of the manners described for FIGS. 1, 2, and/or 3 above. The computer components interior to the computer cluster enclosure 400 include one or more power supplies 420, one or more data storage assemblies 424 consisting of disk drives or other type of storage units, one or more motherboard assemblies 428, and other computer hardware 432 that may be required by a particular application. The motherboard assembly 428, power supply assembly 420, data storage assembly 424, and customized computer assembly 432 are assemblies that contain standard computer components that have been arranged in a manner to facilitate proper computer operation and optimal heat transfer; each assembly is fully enclosed as a unit in order to either contain a secondary cooling fluid such as a dielectric or to isolate the assembly from direct contract with either the primary or another secondary cooling fluid. Each assembly 428, 420, 424, 432 will have cable entrances for power and electrical signaling that serve to interconnect the assemblies as required for computer operation. Each assembly 428, 420, 424, 432 may be mounted in such a fashion as to transfer heat directly from the assembly to the wall of the computer cluster enclosure. Alternatively or additionally, each assembly 428, 420, 424, 432 could be mounted in a fashion to maximize the assembly's 428, 420, 424, 432 contact with cooling fluid 410 within computer cluster enclosure 400. The computer components interior to the enclosure 400 do not need to be arranged exactly as shown and may have various arrangements to facilitate heat transfer and operation. The circulation of the cooling fluid 410 may be reversed by moving the sealing cap 416 through which the cooling fluid 412 is forced to the bottom of the computer cluster enclosure 400. Multiple computer cluster enclosures 400 may be connected in a single logical and/or physical structure as to form a single operating and/or installed unit.

Figure 7:
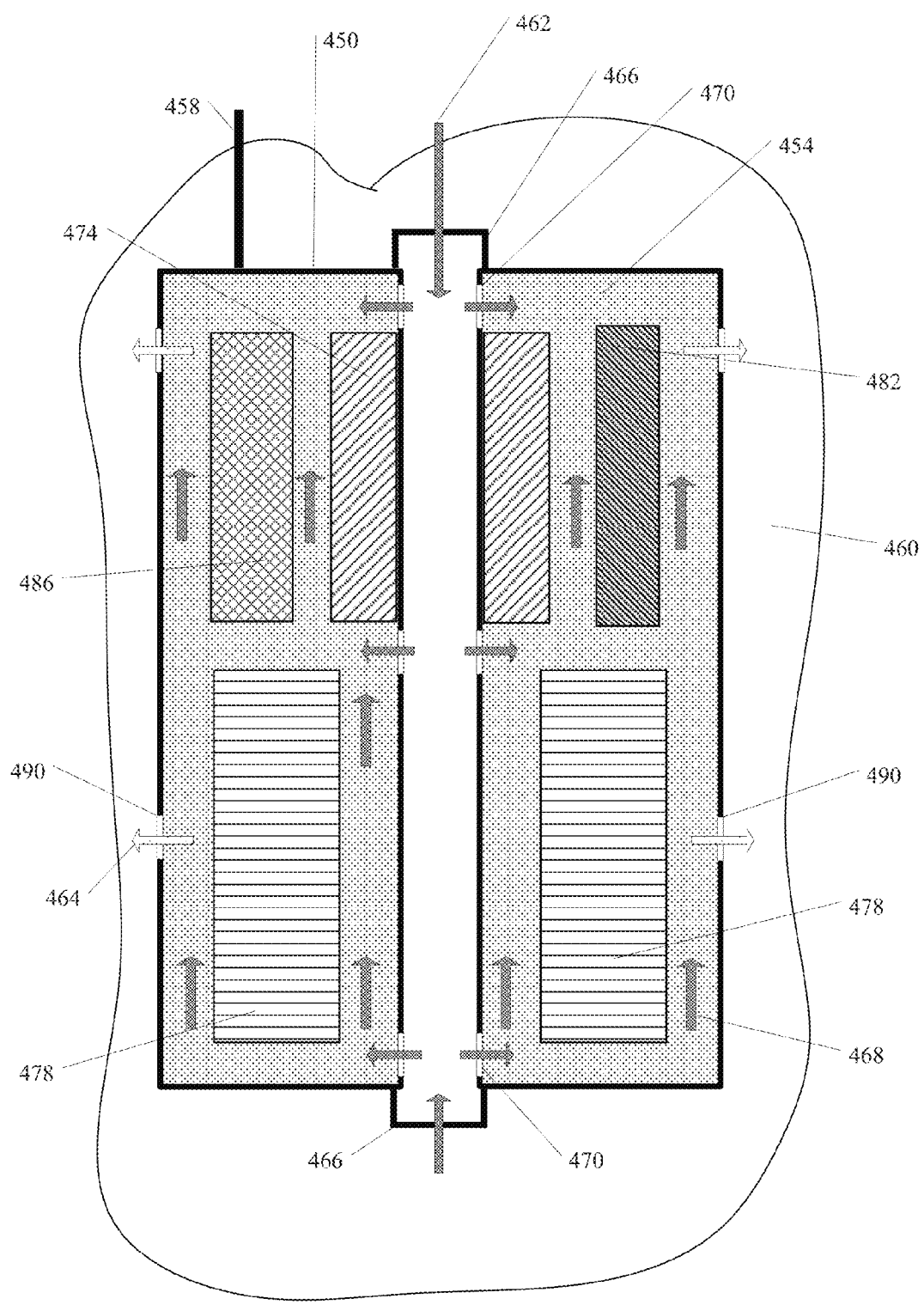
FIG. 7 shows a conceptual cross-section of a computer cluster designed for subsurface installation that contains computer component assemblies that are cooled by interior channel and internal cooling fluid circulation according to an embodiment of the disclosed subject matter.

FIG. 7 shows a conceptual cross-section of an embodiment of a computer cluster. This embodiment has a pipe-like cylindrical or tubular enclosure of various cross-sectional geometries and lengths that allow the flow of cooling fluid 460 through one or more channels in its central space, into the interior of the computer cluster enclosure 450, and around the interior assemblies 468. The computer cluster enclosure 450 has a fluid filled interior space 454 and an entry port for power, control and electrical signal cabling 458. The exterior surface of the computer cluster enclosure 450 is in contact with a surrounding cooling fluid 460. The computer cluster enclosure 450 has one or more upper and lower sealing caps 466 through which the cooling fluid is forced 462. The cooling fluid 460 enters the interior space 454 through one or more entry ports 470; once inside the interior space 454, the cooling fluid 460 is warmed by contact with the interior assemblies 468, and the cooling fluid 460 exits the enclosure 464 through the exit ports 490 into the containment vessel. The cooling fluid 460 is circulated and cooled any of the manners described for FIGS. 1, 2, and/or 3 above. The computer components interior to the computer cluster enclosure 450 include one or more power supplies 474, one or more data storage assemblies 478 consisting of disk drives or other type of storage units, one or more motherboard assemblies 482, and other computer hardware 486 that may be required by a particular application. The motherboard assembly 482, power supply assembly 474, data storage assembly 478, and customized computer assembly 486 are assemblies that contain standard computer components that have been arranged in a manner to facilitate proper computer operation and optimal heat transfer; each assembly is fully enclosed as a unit in order to either contain a secondary cooling fluid such as a dielectric or to isolate the assembly from direct contract with either the primary or another secondary cooling fluid. Each assembly 482, 474, 478, 486 will have cable entrances for power and electrical signaling that serve to interconnect the assemblies as required for computer operation. Alternatively or additionally, each assembly 482, 474, 478, 486 could be mounted in a fashion to maximize the assembly's 482, 474, 478, 486 contact with cooling fluid 460 within computer cluster enclosure 450. Each assembly 482, 474, 478, 486 may be mounted in such a fashion as to transfer heat directly from the assembly to the wall of the computer cluster enclosure. The computer components interior to the enclosure 450 do not need to be arranged exactly as shown and may have various arrangements to facilitate heat transfer and operation. The circulation of the cooling fluid 460 may be reversed by removing the warmed fluid from one or more channels in central space of the computer cluster enclosure 450 and introducing the cooled fluid into the computer cluster enclosure 450 via the exit ports 490. Multiple computer cluster enclosures 450 may be connected in a single logical and/or physical structure as to form a single operating and/or installed unit.

Although example diagrams to implement the elements of the disclosed subject matter have been provided, one skilled in the art, using this disclosure, could develop additional embodiments to practice the disclosed subject matter and each is intended to be included herein. Although many of the embodiments refer to a computer system or systems, this is merely exemplary and is not intended to limit the scope of this disclosure as the disclosed subject matter could be employed by someone skilled in the art, with the assistance of this disclosure, to cool any item which produces heat. Additionally, although discussed throughout as using geothermal cooling as the heat transfer process, one skilled in the art, with the assistance of this disclosure, could implement the teachings using alternate forms of heat transfer. Further, although discussed throughout as being positioned predominantly subsurface, one skilled in the art, with the assistance of this disclosure, could implement the teachings in a non-subsurface position. Finally, the embodiments disclosed could function without the need for traditional forced or passive air cooling.

In addition to the above described embodiments, those skilled in the art will appreciate that this disclosure has application in a variety of arts and situations and this disclosure is intended to include the same.

| PARTS LIST | |
|---|---|
| FIG. 1. | |
| 100 | Containment vessel |
| 104 | Sealing cap |
| 108 | Surface level |
| 110 | Containment vessel walls extending to surface (optional) |
| 112 | Surrounding physical material |
| 114 | Liquid-tight connector assembly |
| 116 | Computer hardware system |
| 120 | Cooling fluid |
| 122 | Cooling fluid surface level |
| 124 | Fluid cooled by geothermal heat transfer |
| 126 | Power and signal cabling |
| 128 | Fluid warmed by computer hardware systems |
| 132 | Fluid circulator (optional) |
| FIG. 2. | |
| 150 | Containment vessel |
| 152 | Surrounding physical materials |
| 154 | Sealing cap |
| 156 | Geothermal heat exchange system (or other heat exchanger) |
| 158 | Surface level |
| 160 | Containment vessel walls extending to surface (optional) |
| 162 | Power and signal cabling |
| 164 | Liquid-tight connector assembly |
| 166 | Computer hardware system |
| 168 | Cooling fluid |
| 170 | Cooling fluid surface level |
| 172 | Fluid warmed by computer hardware systems |
| 176 | Re-entering fluid cooled by geothermal (or other) heat exchange method |
| FIG. 3. | |
| 200 | Containment vessel |
| 202 | Surrounding physical materials |
| 204 | Sealing cap |
| 206 | Optional panel or port for human access to containment vessel interior |
| 208 | Surface level |
| 210 | Secondary containment vessel |
| 212 | Power and signal cabling |
| 214 | Liquid-tight connector assembly |
| 216 | Computer hardware system |
| 218 | Cooling fluid |
| 220 | Cooling fluid surface level |
| 222 | Fluid warmed by computer hardware systems |
| 224 | Geothermal heat exchange system (or other heat exchanger) |
| 226 | Re-entering fluid cooled by geothermal (or other) heat exchange method |
| FIG. 4. | |
| 300 | Computer cluster enclosure |
| 304 | Fluid-filled interior space |
| 308 | Power and signal cabling |
| 312 | Surrounding cooling fluid |
| 316 | Power supply assembly or subsystem |
| 320 | Data storage assembly or subsystem |
| 324 | Motherboard assembly or subsystem |
| 328 | Customized computer assembly or subsystem |
| FIG. 5. | |
| 350 | Computer cluster enclosure |
| 354 | Fluid-filled interior space |
| 358 | Power and signal cabling |
| 360 | Cooling fluid |

-continued

PARTS LIST

| | |
|---|---|
| 362 | Forced flow of cooling fluid |
| 364 | Upward flow of cooling fluid warmed by contact with electronic devices or assemblies |
| 366 | Sealing cap |
| 370 | Power supply assembly or subsystem |
| 374 | Data storage assembly or subsystem |
| 378 | Motherboard assembly or subsystem |
| 382 | Customized computer or other electronics assembly |

FIG. 6.

| | |
|---|---|
| 400 | Computer cluster enclosure |
| 404 | Fluid-filled interior space |
| 408 | Power and signal cabling |
| 410 | Cooling fluid |
| 412 | Forced flow of cooling fluid into enclosure |
| 414 | Forced flow of cooling fluid out of enclosure |
| 416 | Sealing cap |
| 418 | Cooling fluid warmed by contact with electronic devices or assemblies |
| 420 | Power supply assembly or subsystem |
| 424 | Data storage assembly or subsystem |
| 428 | Motherboard assembly or subsystem |
| 432 | Customized computer or other electronics assembly |
| 440 | Exit port |

FIG. 7.

| | |
|---|---|
| 450 | Computer cluster enclosure |
| 454 | Fluid-filled interior space |
| 458 | Power and signal cabling |
| 460 | Cooling fluid |
| 462 | Forced flow of cooling fluid into enclosure |
| 464 | Forced flow of cooling fluid out of enclosure |
| 466 | Sealing cap |
| 468 | Cooling fluid warmed by contact with electronic devices or assemblies |
| 474 | Power supply assembly or subsystem |
| 478 | Data storage assembly or subsystem |
| 482 | Motherboard assembly or subsystem |
| 486 | Customized computer or other electronics assembly |
| 490 | Exit port |

What is claimed is:

1. A system for cooling electronic devices installed in a subsurface environment, the system comprising:
    a containment vessel comprising:
        a cap forming a sealing enclosure of said containment vessel;
        a thermally conductive fluid at least partially filling an interior space of said containment vessel;
        one or more electronic devices disposed within the interior space of said containment vessel, one or more electronic devices being in direct, indirect, or direct and indirect thermal contact with said thermally conductive fluid to perform heat exchange between the electronic devices and to yield a heated thermally conductive fluid;
        a piping assembly configured for flow of said heated thermally conductive fluid from the interior space of said containment vessel through an opening in said containment vessel that guides said heated thermally conductive fluid to a location external to said containment vessel in order to transfer heat away from the close proximity of said containment vessel and generate a cooled thermally conductive fluid;
        said piping assembly configured for flow of said cooled thermally conductive fluid from a location external to said containment vessel through an opening in said containment vessel to the interior space of said containment vessel that guides the flow of said cooled thermally conductive fluid to the interior space of said containment vessel; and
        one or more openings in said containment vessel through which cabling is extended from the interior space of said containment vessel to a location external to said containment vessel connecting between an external location and at least one of the one or more electronic devices within said containment vessel; and
    a heat exchanger circuit comprising:
        a heat exchanger located remote and nonadjacent to said containment vessel for receiving heated thermally conductive fluid from at least one containment vessel for performing a cooling operation;
        said piping assembly configured for flow of said heated thermally conductive fluid for guiding the flow of said heated thermally conductive fluid to the heat exchanger; and
        said piping assembly configured for flow of said cooled thermally conductive fluid for guiding the flow of said cooled thermally conductive fluid from the heat exchanger to at least one containment vessel;
        said piping assembly comprising an inlet, said inlet positioned at an inlet position in said containment vessel; and an outlet, said outlet positioned at an outlet position in said containment vessel; and
        wherein said outlet position includes being located below said inlet position;
    and further wherein said containment vessel is disposed predominantly in a subsurface environment that is not intended to be a human-inhabited space.

2. The system of claim 1, the subsurface environment including at least one of:
    a body of water;
    a borehole;
    an excavation; or
    an underground structure.

3. The system of claim 2, the subsurface environment being the body of water, wherein the body of water has a surface exposed to open air.

4. The system of claim 1, wherein the one or more electronic devices are grouped into one or more individual subsystems, wherein each of the groups are enclosed in individual cases or housings within said containment vessel.

5. The system of claim 4, additionally comprising at least two individual cases or housings and wherein each of the individual cases or housings are positioned such that at least one external surface of each of the individual cases or housings is touching at least one other external surface of another of the individual cases or housings.

6. The system of claim 1, wherein said containment vessel is comprised of a thermally conductive material.

7. The system of claim 1, additionally comprising one or more internal circulating devices, the one or more internal circulating devices circulating the first thermally conductive fluid within said containment vessel.

8. The system of claim 1, additionally comprising one or more cables, the one or more cables passing through the one or more openings in said containment vessel, the one or more cables including at least one of:
    a power cable;
    a control cable;
    a data cable;
    a communications cable; or
    a signal cable.

9. The system of claim 1, additionally comprising one or more maintenance panels through which a person may access the interior space of said containment vessel.

10. The system of claim 1, wherein said containment vessel is disposed within a subsurface opening larger than said containment vessel to provide a human access to at least a portion of an exterior of said containment vessel.

11. The system of claim 1, wherein said containment vessel is removable from the sub-surface environment.

12. The system of claim 1, wherein at least one of the one or more electronic devices is:
   a power supply;
   a motherboard;
   a memory module;
   a central processing unit;
   a magnetic, optical, or electronic data storage unit; or
   a data transfer device.

13. A method for cooling electronic devices installed in a subsurface environment, the method comprising:
   containing electronic devices in a subsurface environment comprising a containment vessel:
   forming a sealing enclosure using a cap on said containment vessel;
   at least partially filling an interior space of said containment vessel with a thermally conductive fluid;
   disposing one or more electronic devices within the interior space of said containment vessel, and thermally contacting one or more electronic devices directly, indirectly, or directly and indirectly with said thermally conductive fluid to perform heat exchange between the one or more electronic devices and to yield a heated thermally conductive fluid;
   configuring a piping assembly for flow of said heated thermally conductive fluid from the interior space of said containment vessel through an opening in said containment vessel that guides said heated thermally conductive fluid to a location external to said containment vessel in order to transfer heat away from the close proximity of said containment vessel and generate a cooled thermally conductive fluid;
   configuring said piping assembly for flow of said cooled thermally conductive fluid from a location external to said containment vessel through an opening in said containment vessel to the interior space of said containment vessel that guides the flow of said cooled thermally conductive fluid to the interior space of said containment vessel; and
   extending cabling through one or more openings in said containment vessel from the interior space of said containment vessel to a location external to said containment vessel connecting between an external location and at least one of the one or more electronic devices within said containment vessel; and
   converting said heated thermally conductive fluid into said cooled thermally conductive fluid using a heat exchanger circuit comprising the steps of:
   locating a heat exchanger remote and nonadjacent to said containment vessel and receiving heated thermally conductive fluid from at least one containment vessel for performing a cooling operation;
   configuring said piping assembly for flow of said heated thermally conductive fluid and guiding the flow of said heated thermally conductive fluid to the heat exchanger; and
   configuring said piping assembly configured for flow of said cooled thermally conductive fluid and guiding the flow of said cooled thermally conductive fluid from the heat exchanger to at least one containment vessel;
   said piping assembly comprising an inlet and positioning said inlet at an inlet position in said containment vessel; and an outlet and positioning said outlet at an outlet position in said containment vessel;
   wherein positioning said outlet includes positioning said outlet below said inlet;
   and further disposing said containment vessel predominantly in a subsurface environment that is not intended to be a human inhabited space.

14. The method of claim 13, the subsurface environment including at least one of:
   a body of water;
   a borehole;
   an excavation; or
   an underground structure.

15. The method of claim 14, the subsurface environment being the body of water, wherein the body of water has a surface exposed to open air.

16. The method of claim 13, wherein the one or more electronic devices are grouped into one or more individual subsystems, wherein each of the groups are enclosed in individual cases or housings within said containment vessel.

17. The method of claim 13, additionally comprising at least two individual cases or housings and wherein each of the individual cases or housings are positioned such that at least one external surface of each of the individual cases or housings is touching at least one other external surface of another of the individual cases or housings.

18. The method of claim 13, wherein said containment vessel is comprised of a thermally conductive material.

19. The method of claim 13, with the additional step of circulating the thermally conductive fluid within said containment vessel by one or more internal circulating devices.

20. The method of claim 13, additionally comprising one or more cables, the one or more cables passing through the one or more openings in said containment vessel, the one or more cables including at least one of:
   a power cable;
   a control cable;
   a data cable;
   a communications cable; or
   a signal cable.

21. The method of claim 13, additionally comprising one or more maintenance panels through which a person may access the interior space of said containment vessel.

22. The method of claim 13, wherein said containment vessel is disposed within a subsurface opening larger than said containment vessel to provide a human access to at least a portion of an exterior of said containment vessel.

23. The method of claim 13, wherein said containment vessel is removable from the sub-surface environment.

24. The method of claim 13, wherein at least one of the one or more electronic devices is:
   a power supply;
   a motherboard;
   a memory module;
   a central processing unit;
   a magnetic, optical, or electronic data storage unit; or
   a data transfer device.

* * * * *